April 6, 1965 R. F. WOOD 3,177,437

VERTICAL DEFLECTION CIRCUIT

Filed July 10, 1961

INVENTOR:
ROBERT F. WOOD,

BY Joseph Levinson

HIS ATTORNEY.

United States Patent Office 3,177,437

Patented Apr. 6, 1965

3,177,437

VERTICAL DEFLECTION CIRCUIT

Robert F. Wood, Baldwinsville, N.Y., assignor to General Electric Company, a corporation of New York Filed July 10, 1961, Ser. No. 122,711
9 Claims. (Cl. 330—10)

Figure 1:
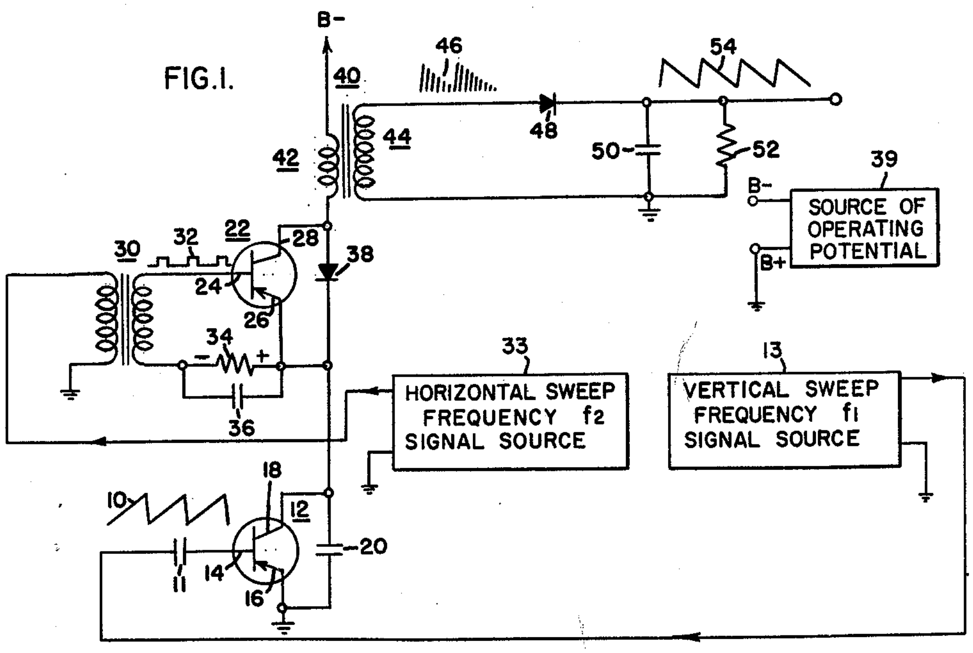

This invention relates to a vertical deflection circuit arrangement for an electron-beam display device.

Some electron-beam display devices require a sawtooth voltage waveform of several thousand volts for providing vertical deflection of the beam. A display device of this type is described in copending application Serial No. 141,863, filed September 29, 1961, and assigned to the assignee of the present invention.

In conventional transformerless circuit arrangements for providing high level vertical deflection voltages, a sawtooth voltage waveform is derived from a multivibrator or blocking oscillator circuit and amplified by an amplifier stage to a peak-to-peak amplitude which is generally no larger than twice the direct current supply voltage level. Such an arrangement cannot always provide the necessary high deflection voltages which are required in the referred-to display devices and in addition requires relatively expensive power supplies. Furthermore, when transistors are utilized in the vertical drive circuit, the direct current supply voltages are relatively low and consequently limit the amplitude of the generated voltage to an amplitude far less than required.

The use of a transformer to step-up the amplitude of the generated vertical sawtooth voltage to a desired level is impractical because of a dual requirement for a large voltage step-up ratio and relatively low frequency response characteristic necessary for transmitting, without distortion, sawtooth waveforms at vertical deflection rates.

Accordingly, it is an object of this invention to provide a new vertical deflection circuit which provides a large peak-to-peak sawtooth voltage waveform.

A further object of this invention is to provide a new vertical deflection circuit which permits the use of a practical transformer.

Still a further object of this invention is to provide a new and improved transistorized vertical deflection circuit which provides the necessary vertical sawtooth voltage amplitude for an electrostatic deflection system.

In carrying out this invention, a source of a first signal having a desired waveform and a frequency $f_1$ and a source of a second signal of frequency $f_2$ which is relatively greater than $f_1$ are provided in an electrical apparatus. Signal generating circuit means including an amplifying device and a transformer having primary and secondary windings are provided. Means couple the first and second signals to the amplifying device. The signal generating circuit means is arranged in a manner for generating in the primary winding a signal of frequency $f_2$ having a waveform corresponding to the waveform of the first signal. Detection circuit means are provided and coupled to the secondary winding for providing an output signal of frequency $f_1$ and having a waveform corresponding to the waveform of the first signal.

Figure 2:
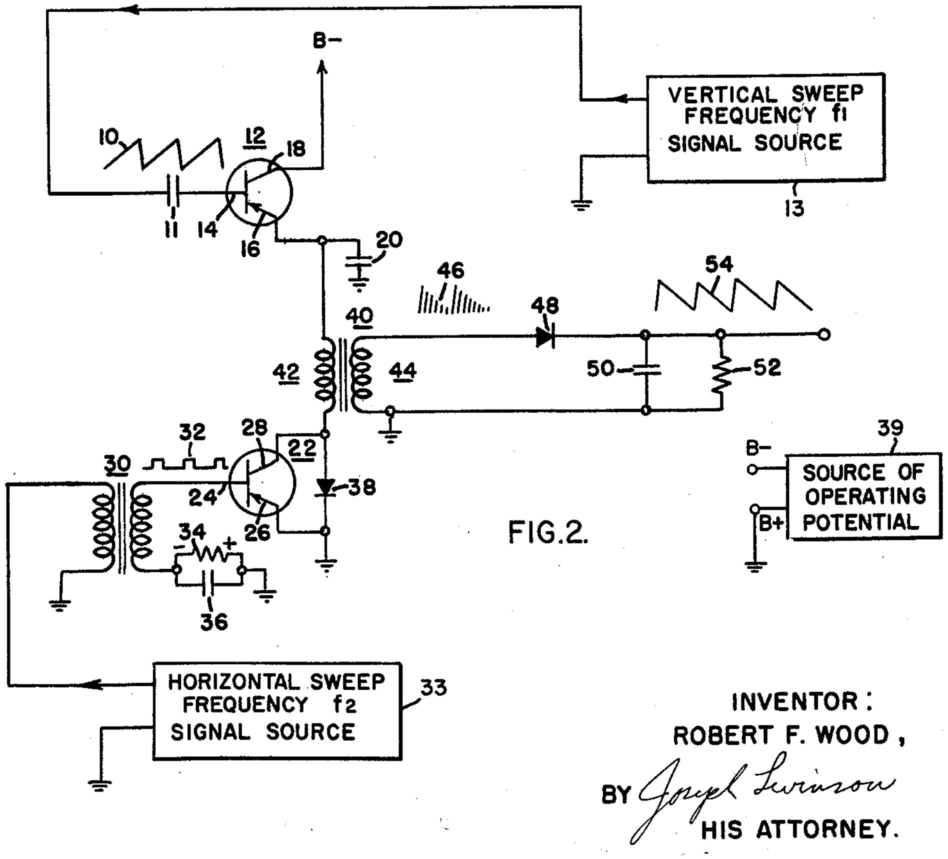

The invention, both as to organization and method of operation, together with further objects and advantages thereof, may best be understood by reference to the following description taken in connection with the accompanying drawings, in which:

FIGURE 1 is a schematic diagram of the new vertical deflection circuit embodied in this invention, and FIGURE 2 is a schematic diagram of another embodiment of this invention.

Referring now to FIGURE 1, the vertical deflection circuit of this invention includes a first transistor 12 having a base electrode 14, an emitter electrode 16 and a collector electrode 18, and a second transistor 22 having a base electrode 24, an emitter electrode 26 and a collector electrode 28. A first electrical signal comprising a vertical sawtooth voltage 10 of frequency of, which is shown derived from a source, indicated generally by the block 13 which may comprise a conventional multivibrator or blocking oscillator, (not shown) is coupled via a capacitor 11 to the base electrode 14 of the first transistor 12. The transistor 12 is arranged in a grounded emitter circuit-configuration and provides an amplified sawtooth signal at the collector electrode 18. A bypass capacitor 20 is connected between the collector electrode 18 and ground and is sufficiently large to by-pass frequencies relatively greater than of, yet is small enough to permit the sawtooth output voltage to decay at its required rate.

The signal at collector electrode 18 of transistor 12 is coupled to the emitter electrode 26 of the transistor 22. A second electrical signal which may comprise a horizontal sweep frequency signal 32 of frequency $f_2$ is coupled by a transformer 30 to the base electrode 24 of the second transistor 22. When the present invention is utilized in a television receiving system, the signal 32 whose source is indicated generally by the block 33 may comprise horizontal synchronizing pulses or horizontal flyback pulses both of which have the same frequency and are readily available from the horizontal sweep system of the television receiver. The transistor 22 is biased by a resistor 34 which is connected in parallel with a capacitor 36 between the emitter 26 and the secondary winding of the transformer 30. A rectifier 38 is connected between the collector electrode 28 and the emitter electrode 26. An operating potential derived from a supply source 39 is coupled to the collector electrode 28 via a primary winding 42 of a transformer 40 and to the emitter electrode 16 via a ground connection. The transformer 40 has a primary winding 42 and a secondary winding 44 with a large voltage from primary to secondary winding, e.g. 1:100. A signal of frequency $f_2$ and waveform corresponding to the first signal is generated in the primary winding and stepped up in amplitude by the transformer for providing a signal which is coupled via the secondary winding to a detector circuit comprising rectifier 48, a capacitor 50, and a resistor 52. An RC time constant which is provided by the resistor 52 and the capacitor 50 permits a filtering of the component of frequency $f_2$ while permitting a sufficient decay time to recover an output signal having a waveform 54 corresponding to the waveform of the first electrical signal.

In operation, the first electrical signal comprising a vertical sawtooth signal 10 having a frequency $f_1$=60 c.p.s. and which is applied to the transistor 12 produces an amplified signal which is applied to the emitter electrode 26 of transistor 22. The transistor 22 produces a collector current at the collector electrode 28 which increases linearly until a large positive going pulse segment of the horizontal sweep frequency signal 32 occurs at the base 24 of transistor 22. This positive going pulse signal cuts the transistor off and a decaying magnetic field in the primary winding 42 of transformer 40 causes a large negative voltage to be generated and applied to the collector 28 of transistor 22 and also to the rectifier 38. The rectifier 38 is utilized for damping out overshoot in this ringing voltage as in conventional television receiver horizontal output stages in order to increase the efficiency of the system. At the termination of the positive going pulse, the transistor 22 begins conducting and the current through the collector electrode 28 again begins to increase until the next positive going pulse occurs. As can be seen, the operating potential for the transistor 22 is varied at a vertical frequency rate $f_1$ with the carrier frequency $f_2$ being that of the horizontal sweep frequency and a signal is generated in the primary winding of frequency $f_2$ having a waveform corresponding to the first electrical signal. The transformer 40 steps up the voltage of the signal, which is generated in the primary winding, to a desired level and this stepped-up voltage is detected by the detector circuit to produce an output vertical deflection signal voltage 54 across the resistor 52.

The configuration shown in FIGURE 2 operates in a similar manner as the circuit shown in FIGURE 1. In FIGURE 2, the transistor 22 is arranged as an emitter follower amplifier instead of the grounded emitter configuration shown in FIGURE 1. This type of configuration is useful when a greater amount of vertical drive signal is available and a power output is desired. The circuit of FIGURE 1 is more advantageous when voltage amplification provided by transistor 22 is essential.

The invention therefore provides for the generation of a signal of frequency $f_2$ having an envelope corresponding to the waveform of the first signal, stepping up the amplitude of the generated signal modulated by transformer means and detecting an output signal to produce an output signal of desired waveform and relatively low frequency while still utilizing a practical transformer. By utilizing the horizontal sweep frequency in a television receiver as a carrier signal, the circuitry for the vertical sweep circuit is simplified and less expensive to build.

Since other modifications and changes varied to fit particular operating requirements and environments will be apparent to those skilled in the art, this invention is not considered limited to the examples chosen for purposes of disclosure and covers all changes and modifications which do not constitute departures from the true spirit and scope of this invention.

What I claim as new and desire to secure by Letters Patent of the United States is:

1. A circuit arrangement for generating a high level sawtooth deflection voltage for an electron beam display device comprising: a source of a first electrical signal of sawtooth waveform and frequency $f_1$; a source of a second electrical signal of a relatively higher frequency $f_2$; electrical signal generating circuit means including an amplifying device and a transformer having primary and secondary windings, said transformer wound for providing a large voltage step-up ratio from said primary to said secondary winding; means coupling said first and said second electrical signals from said respective sources to said signal generating circuit means; said signal generating circuit means being responsive to said first and second electrical signals to generate in said primary winding an electrical signal of frequency $f_2$ having an envelope corresponding to the waveform of said first electrical signal; and detection circuit means coupled to said secondary winding and arranged for providing a detected voltage of frequency $f_1$ and sawtooth waveform corresponding to the waveform of said first electrical signal.

2. In an electrical receiving apparatus having an electron beam display device and means providing horizontal deflection of the electron beam at a frequency $f_2$, a circuit arrangement for generating a high level sawtooth vertical deflection voltage for the device comprising: a source of a first electrical signal of sawtooth waveform and a desired vertical deflection frequency $f_1$; horizontal deflection circuit means for providing a second electrical signal of horizontal deflection frequency $f_2$; signal generating circuit means including an amplifying device and a transformer having primary and secondary windings, said transformer wound for providing a large voltage step-up from said primary to said secondary winding; means coupling said first and said second electrical signals from said source and deflection circuit means respectively to said amplifying device; said signal generating circuit means being responsive to said first and second electrical signals to generate in said primary winding an electrical signal of frequency $f_2$ having an envelope corresponding to the sawtooth waveform of said first electrical signal; and the detection circuit means coupled to said secondary winding and arranged in a manner for providing a detected voltage of frequency $f_1$ and sawtooth waveform corresponding to the waveform of said first electrical signal.

3. In an electrical receiving apparatus having an electron beam display device and means providing horizontal deflection of the electron beam at a frequency $f_2$, a circuit arrangement for generating a high level sawtooth vertical deflection voltage for the device comprising: a source of a first electrical signal having a sawtooth waveform and frequency $f_1$; horizontal deflection circuit means providing a second electrical signal of horizontal deflection frequency $f_2$; signal generating circuit means including first and second amplifying devices each having input electrodes, a transformer having primary and secondary windings, said transformer wound for providing a large voltage step-up from said primary to said secondary winding, said primary winding being coupled to said second amplifying device; means coupling a first electrical signal from said source to said input electrode of said first amplifying device; means coupling said second electrical signal from said horizontal circuit deflection means to said input electrode of said second amplifying device; said first amplifying device being responsive to said first electrical signal to develop an amplified sawtooth signal at said frequency $f_1$; means coupling said amplified sawtooth signal to said second amplifying device, said second amplifying device being responsive to said amplified sawtooth signal and said second electrical signal to generate in said primary winding an electrical signal of frequency $f_2$ having an envelope corresponding to the sawtooth waveform of said first electrical signal; and detection circuit means coupled to said secondary winding including a rectifier and RC load circuit for providing a detected output sawtooth voltage waveform of vertical sweep frequency $f_1$.

4. In an electrical receiving apparatus having an electron beam display device and means providing horizontal deflection of the electron beam at a frequency $f_2$, a circuit arrangement for generating a high level sawtooth vertical deflection voltage for the device comprising: a source of a first electrical signal having a sawtooth waveform of vertical deflection frequency $f_1$; horizontal circuit deflection means providing a second signal of horizontal deflection frequency $f_2$; signal generating circuit means including first and second transistor amplifying devices each having base, emitter and collector electrodes, and a transformer having primary and secondary windings, said transformer wound for providing a large voltage step-up from said primary to said secondary winding, and a source of operating potential for said amplifying devices; means coupling said primary winding between said source of operating potential and collector electrode of said second transistor; means coupling the second signal from said horizontal circuit deflection means to said base electrode of said second transistor; means coupling the first signal from said source to said base electrode of said first transistor; means coupling said collector electrode of said first transistor to said emitter electrode of said second transistor; and detection circuit means including a rectifier and RC load circuit coupled to said secondary winding and arranged for providing a detected voltage of frequency $f_1$ and sawtooth waveform.

5. In an electrical receiving apparatus having an electron beam display device and means providing horizontal deflection of the electron beam at a frequency $f_2$, a circuit arrangement for generating a high level sawtooth vertical deflection voltage for the device comprising: first and second transistor amplifying devices each having base, emitter, and collector electrodes; a source of operating potential for said amplifying devices; a transformer having primary and secondary winding, said transformer wound in a manner for providing a large voltage step-up from said primary to said secondary winding; means direct-current coupling said primary winding between said source of potential and said collector electrode of said second transistor; means direct-current coupling said collector electrode of said first transistor to said emitter electrode of said second transistor; means providing a first signal of vertical deflection frequency $f_1$ having a sawtooth waveform; means providing a second signal of horizontal deflection frequency $f_2$; means coupling said first signal to said base electrode of said first transistor; means coupling said second signal to said base electrode of said second transistor; and a detection circuit including a rectifier and RC load circuit coupled to said secondary winding for providing a high-level sawtooth voltage of frequency $f_1$.

6. In an electrical receiving apparatus having an electron beam display device and means providing horizontal deflection of the electron beam at a frequency $f_2$, a circuit arrangement for generating a high level sawtooth vertical deflection voltage for the device comprising: first and second transistor amplifying devices each having base, emitter, and collector electrodes; a source of operating potential for said amplifying devices; a transformer having primary and secondary winding, said transformer wound in a manner for providing a large voltage step-up from said primary to said secondary winding; means connecting said primary winding between said source of potential and said collector electrode of said second transistor; means connecting said collector electrode of said first transistor to said emitter electrode of said second transistor; means providing a first signal of vertical deflection frequency $f_1$ having a sawtooth waveform; means providing a second signal of horizontal deflection frequency $f_2$; means coupling said first signal to said base electrode of said first transistor; means coupling said second signal to said base electrode of said second transistor; and a detection circuit including a rectifier and RC load circuit connected to said secondary winding for providing a high-level sawtooth voltage of frequency $f_1$.

7. In an electrical receiving apparatus having an electron beam display device and means providing horizontal deflection of the electron beam at a frequency $f_2$, a circuit arrangement for generating a high level sawtooth vertical deflection voltage for the device comprising: a source of a first electrical signal having a sawtooth waveform of vertical deflection frequency $f_1$; horizontal circuit deflection means providing a second signal of horizontal deflection frequency $f_2$; signal generating circuit means including first and second transistor amplifying devices each having base, emitter, and collector electrodes, a transformer having primary and secondary windings, said transformer wound in a manner for providing a large voltage step-up from said primary to said secondary winding and a source of operating potential for said amplifying devices; means coupling said primary winding between said emitter electrode of said first transistor and said collector electrode of said second transistor; means coupling the first signal from said source to said base electrode of said first transistor; means coupling the second signal from said horizontal circuit deflection means to said base electrode of said second transistor; means coupling said operating potential source between said collector and emitter electrodes of said first and second transistors respectively; and detection circuit means coupled to said secondary winding and arranged for providing a detected voltage of frequency $f_1$ and sawtooth waveform.

8. In an electrical receiving apparatus having an electron beam display device and means providing horizontal deflection of the electron beam at a frequency $f_2$, a circuit arrangement for generating a high level sawtooth vertical deflection voltage for the device comprising: first and second transistor amplifying devices each having base, emitter, and collector electrodes; a source of operating potential for said devices; a transformer having primary and secondary windings, said transformer wound in a manner for providing a large voltage step-up from said primary to said secondary winding; means direct-current coupling said primary winding between the emitter and collector electrodes of said first and second transistors respectively; means direct-current coupling said source of operating potential between collector and emitter electrodes of said first and second transistors respectively; means providing a first signal of vertical deflection frequency $f_1$ having a sawtooth waveform; means providing a second signal of horizontal deflection frequency $f_2$; means coupling said first signal to said base electrode of said first transistor; means coupling said second signal to said base electrode of said second transistor; and a detection circuit including a rectifier and RC load circuit coupled to said secondary winding for providing a high-level sawtooth voltage for frequency $f_1$.

9. In an electrical receiving apparatus having an electron beam display device and means providing horizontal deflection of the electron beam at a frequency $f_2$, a circuit arrangement for generating a high level sawtooth vertical deflection voltage for the device comprising: first and second transistor amplifying devices each having base, emitter, and collector electrodes; a source of operating potential for said devices; a transformer having primary and secondary windings, said transformer wound in a manner for providing a large voltage step-up from said primary to said secondary winding; means connecting said primary winding between the emitter and collector electrodes of said first and second transistors respectively; means direct-current coupling said source of operating potential between collector and emitter electrodes of said first and second transistor respectively; means providing a first signal of vertical deflection frequency $f_1$ having a sawtooth waveform; means providing a second signal of horizontal deflection frequency $f_2$; means coupling said first signal to said base electrode and said first transistor; means coupling said second signal to said base electrode of said second transistor; and a detection circuit including a rectifier and RC load circuit connected to said secondary winding for providing a high-level sawtooth voltage of frequency $f_1$.

References Cited by the Examiner

UNITED STATES PATENTS

| | | | |
|---|---|---|---|
| 3,003,122 | 10/61 | Gerhard | 332—9 |
| 3,018,447 | 1/62 | Wei | 330—40 X |
| 3,070,727 | 12/62 | Birt. | |
| 3,105,196 | 9/63 | Lerner. | |

FOREIGN PATENTS

| | | |
|---|---|---|
| 763,443 | 12/56 | Great Britain. |

ROY LAKE, *Primary Examiner.*

NATHAN KAUFMAN, *Examiner.*